(12) United States Patent
Balan

(10) Patent No.: US 8,285,418 B2
(45) Date of Patent: Oct. 9, 2012

(54) DUAL SCANNING STAGE

(75) Inventor: Aviv Balan, Mountain View, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 198 days.

(21) Appl. No.: 12/834,220

(22) Filed: Jul. 12, 2010

(65) Prior Publication Data

US 2011/0022227 A1 Jan. 27, 2011

Related U.S. Application Data

(60) Provisional application No. 61/228,076, filed on Jul. 23, 2009.

(51) Int. Cl.
*G05B 19/418* (2006.01)
(52) U.S. Cl. ............. 700/248; 356/237.2; 310/12.15
(58) Field of Classification Search ............. 700/4, 19, 700/245, 247, 248, 251; 356/237.2
See application file for complete search history.

(56) References Cited

U.S. PATENT DOCUMENTS

| | | | | |
|---|---|---|---|---|
| 3,798,705 A * | 3/1974 | Julian et al. | ............... | 16/94 R |
| 4,187,051 A * | 2/1980 | Kirsch et al. | ............... | 414/744.3 |
| 4,870,592 A * | 9/1989 | Lampi et al. | ............... | 700/112 |
| 4,948,208 A * | 8/1990 | Schubert | ............... | 312/334.16 |
| 5,438,647 A * | 8/1995 | Nagamatsu et al. | ............... | 700/247 |
| 5,760,564 A * | 6/1998 | Novak | ............... | 318/687 |
| 5,784,542 A * | 7/1998 | Ohm et al. | ............... | 700/260 |
| 5,969,441 A * | 10/1999 | Loopstra et al. | ............... | 310/12.06 |
| 5,982,128 A * | 11/1999 | Lee | ............... | 318/568.16 |
| 6,128,069 A * | 10/2000 | Korenaga | ............... | 355/53 |
| 6,161,294 A * | 12/2000 | Bland et al. | ............... | 33/1 M |
| 6,318,538 B1 * | 11/2001 | Shibuya | ............... | 198/346.2 |
| 6,321,139 B1 * | 11/2001 | Terada et al. | ............... | 700/248 |
| 6,324,933 B1 * | 12/2001 | Waskiewicz et al. | ............... | 74/490.01 |
| 6,327,929 B1 * | 12/2001 | Yanagisawa | ............... | 74/490.09 |
| 6,360,801 B1 * | 3/2002 | Walter et al. | ............... | 156/354 |
| 6,392,229 B1 * | 5/2002 | Dana et al. | ............... | 850/33 |
| 6,446,949 B2 * | 9/2002 | Schmid et al. | ............... | 269/71 |
| 6,453,214 B1 * | 9/2002 | Bacchi et al. | ............... | 700/245 |
| 6,654,100 B2 * | 11/2003 | Yoda | ............... | 355/53 |
| 6,690,473 B1 * | 2/2004 | Stanke et al. | ............... | 356/601 |
| 6,748,293 B1 * | 6/2004 | Larsen | ............... | 700/218 |
| 6,752,584 B2 * | 6/2004 | Woodruff et al. | ............... | 414/744.5 |

(Continued)

*Primary Examiner* — Behrang Badii
*Assistant Examiner* — Yuri Kan
(74) *Attorney, Agent, or Firm* — Luedeka Neely Group, P.C.

(57) ABSTRACT

A profilometer having a guide beam for providing translational movement of substrates in a Y axis relative to a stylus. A first stage receives a first substrate, where the first stage is slidably mounted to the guide beam. The first stage is associated with a first motor for providing independent translational movement for the first stage in an X axis relative to the stylus. A second stage receives a second substrate, where the second stage is slidably mounted to the guide beam. The second stage is associated with a second motor for providing independent translational movement for the second stage in the X axis relative to the stylus, where the first stage and the second stage move together in the Y axis as the guide beam moves in the Y axis, and move independently of one another in the X axis. A robot loads the substrates onto and unloads the substrates off of the first stage and the second stage. A controller directs the robot to load the second substrate onto the second stage, while simultaneously directing the first stage and the guide beam to scan the first substrate on the first stage in the X and Y axes under the stylus, thereby generating profile readings of the first substrate on the first stage.

7 Claims, 2 Drawing Sheets

U.S. PATENT DOCUMENTS

| | | | |
|---|---|---|---|
| 6,829,054 B2 * | 12/2004 | Stanke et al. | 356/601 |
| 6,852,989 B2 * | 2/2005 | Kwan et al. | 250/491.1 |
| 6,975,383 B2 * | 12/2005 | Morisada | 355/53 |
| 7,079,237 B2 * | 7/2006 | Woo et al. | 356/237.2 |
| 7,292,354 B2 * | 11/2007 | Schrammli et al. | 356/639 |
| 7,306,423 B2 * | 12/2007 | Ogawa et al. | 414/749.1 |
| 7,359,767 B2 * | 4/2008 | Rice et al. | 700/245 |
| 7,512,457 B2 * | 3/2009 | Wood et al. | 700/175 |
| 7,574,282 B2 * | 8/2009 | Petersson et al. | 700/245 |
| 7,860,610 B2 * | 12/2010 | Waldmann et al. | 700/245 |
| 7,945,348 B2 * | 5/2011 | Pannese et al. | 700/248 |
| 7,979,157 B2 * | 7/2011 | Anvari | 700/245 |
| 7,997,847 B2 * | 8/2011 | Treat et al. | 414/222.01 |
| 8,104,752 B2 * | 1/2012 | Eidelberg | 269/60 |
| 2002/0145733 A1 * | 10/2002 | Wada et al. | 356/237.2 |
| 2002/0158197 A1 * | 10/2002 | Dana et al. | 250/306 |
| 2005/0230894 A1 * | 10/2005 | Scharer | 269/55 |
| 2006/0020367 A1 * | 1/2006 | Nangoy | 700/245 |
| 2006/0241813 A1 * | 10/2006 | Babu et al. | 700/255 |
| 2007/0222975 A1 * | 9/2007 | Serikawa et al. | 356/237.2 |
| 2007/0233320 A1 * | 10/2007 | Waldmann et al. | 700/245 |
| 2007/0255453 A1 * | 11/2007 | Brogardh | 700/245 |
| 2007/0263760 A1 * | 11/2007 | Taillandier | 376/261 |
| 2007/0264106 A1 * | 11/2007 | van der Meulen | 414/217 |
| 2008/0086237 A1 * | 4/2008 | Rebstock | 700/248 |
| 2008/0249651 A1 * | 10/2008 | Hosek et al. | 700/121 |
| 2010/0036525 A1 * | 2/2010 | Casanelles et al. | 700/248 |
| 2010/0234991 A1 * | 9/2010 | Zini et al. | 700/248 |
| 2011/0022227 A1 * | 1/2011 | Balan | 700/248 |
| 2011/0096318 A1 * | 4/2011 | Yoshimoto | 355/72 |
| 2012/0004502 A1 * | 1/2012 | Weitzner et al. | 600/102 |

* cited by examiner

DUAL SCANNING STAGE

FIELD

The application claims all rights and priority on prior pending U.S. provisional patent application Ser. No. 61/228,076 filed Jul. 23, 2009. This invention relates to the field of integrated circuit fabrication. More particularly, this invention relates to scanning of substrates, such as during an inspection operation.

INTRODUCTION

Profiling instruments were first developed for the purpose of characterizing integrated circuit substrate surfaces in terms of roughness, waviness, and form. As the term is used herein, "integrated circuit" includes devices such as those formed on monolithic semiconducting substrates, such as those formed of group IV materials like silicon or germanium, or group III-V compounds like gallium arsenide, or mixtures of such materials. The term includes all types of devices formed, such as memory and logic, and all designs of such devices, such as MOS and bipolar. The term also comprehends applications such as flat panel displays, optical disks, solar cells, and charge coupled devices.

In a conventional stylus profilometer, a substrate is placed on an X-Y positioning stage, where the surface of the substrate to be profiled is within the X-Y plane. The profilometer has a stylus that is attached to a sensor. In a data acquisition sequence, at least one of the stage and the stylus is moved relative to the other, while the sensor senses variations in the topography of the substrate under the stylus. In some profilometers it is the stage that is moved, and in other profilometers it is the stylus that is moved.

Stylus profilometers provide for scans in the X-Y plane covering distances that range from a few microns to hundreds of millimeters. The sensors used for profilometers usually have relatively large dynamic range in the Z direction, from as small as a few angstroms to as large as a few hundred micrometers.

The throughput of a profilometer is dependant on the load and unload time of the substrates being measured. Up to about forty percent of the total substrate processing time can be spent on loading, unloading, and aligning the substrates.

What is needed, therefore, is a system that reduces problems such as those described above, at least in part.

SUMMARY OF THE CLAIMS

The above and other needs are met by a profilometer having a guide beam for providing translational movement of substrates in a Y axis relative to a stylus. A first stage receives a first substrate, where the first stage is slidably mounted to the guide beam. The first stage is associated with a first motor for providing independent translational movement for the first stage in an X axis relative to the stylus. A second stage receives a second substrate, where the second stage is slidably mounted to the guide beam. The second stage is associated with a second motor for providing independent translational movement for the second stage in the X axis relative to the stylus, where the first stage and the second stage move together in the Y axis as the guide beam moves in the Y axis, and move independently of one another in the X axis. A robot loads the substrates onto and unloads the substrates off of the first stage and the second stage. A controller directs the robot to load the second substrate onto the second stage, while simultaneously directing the first stage and the guide beam to scan the first substrate on the first stage in the X and Y axes under the stylus, thereby generating profile readings of the first substrate on the first stage.

In this manner, the profilometer does not need to wait for the preceding substrate to be off-loaded and the succeeding substrate to be loaded before commencing readings on the succeeding substrate. Instead, the succeeding substrate is loaded, aligned, and ready for readings to start as soon as the readings on the preceding substrate are completed. Then while the succeeding substrate is being read, the preceding substrate is off-loaded, and another substrate is loaded and prepared for readings. In this manner, the profilometer is continually taking readings, and the throughput of the profilometer is increased.

In various embodiments according to this aspect of the invention, a first Z motor moves the first stage in a Z axis relative to the stylus, and a second Z motor moves the second stage in the Z axis relative to the stylus, where the movement of the first stage in the Z axis is independent of the movement of the second stage in the Z axis. In some embodiments a first rotational motor rotates the first stage relative to the stylus, and a second rotational motor rotates the second stage relative to the stylus, where the rotation of the first stage is independent of the rotation of the second stage. In some embodiments the robot includes a first robot and a second robot, where the first robot loads the first substrate onto and unloads the first substrate off of the first stage, and the second robot loads the second substrate onto and unloads the second substrate off of the second stage.

According to another aspect of the invention there is described a method of profiling a first substrate and a second substrate by loading the first substrate onto a first stage, scanning the first stage in an X axis and a Y axis, and generating profile readings of the first substrate with a stylus. The second substrate is loaded onto a second stage while continuing to generate the profile readings of the first substrate, and scanning the second stage in the X axis and the Y axis, where movement in the X axis is independent between the first stage and the second stage, and movement in the Y axis is not independent between the first stage and the second stage. Profile readings of the second substrate are generated with the stylus while the first substrate is unloaded from the first stage.

In various embodiments according to this aspect of the invention, the first stage is moved in a Z axis relative to the stylus, and the second stage is moved in the Z axis relative to the stylus, where the movement of the first stage in the Z axis is independent of the movement of the second stage in the Z axis. In some embodiments the first stage is rotated relative to the stylus, and the second stage is rotated relative to the stylus, where the rotation of the first stage is independent of the rotation of the second stage.

According to yet another aspect of the invention there is described a profilometer having a guide beam for providing translational movement of substrates in a Y axis relative to a stylus, a first stage for receiving a first substrate, the first stage slidably mounted to the guide beam, a second stage for receiving a second substrate, the second stage slidably mounted to the guide beam, a motor for providing translational movement for the first stage and the second stage in an X axis relative to the stylus, where the first stage and the second stage move together in the Y axis as the guide beam moves in the Y axis, and move together in the X axis according to the operation of the motor, and a robot for loading the substrates onto and unloading the substrates off of the first stage and the second stage.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the different views, and in which.

DETAILED DESCRIPTION

Figure 1:
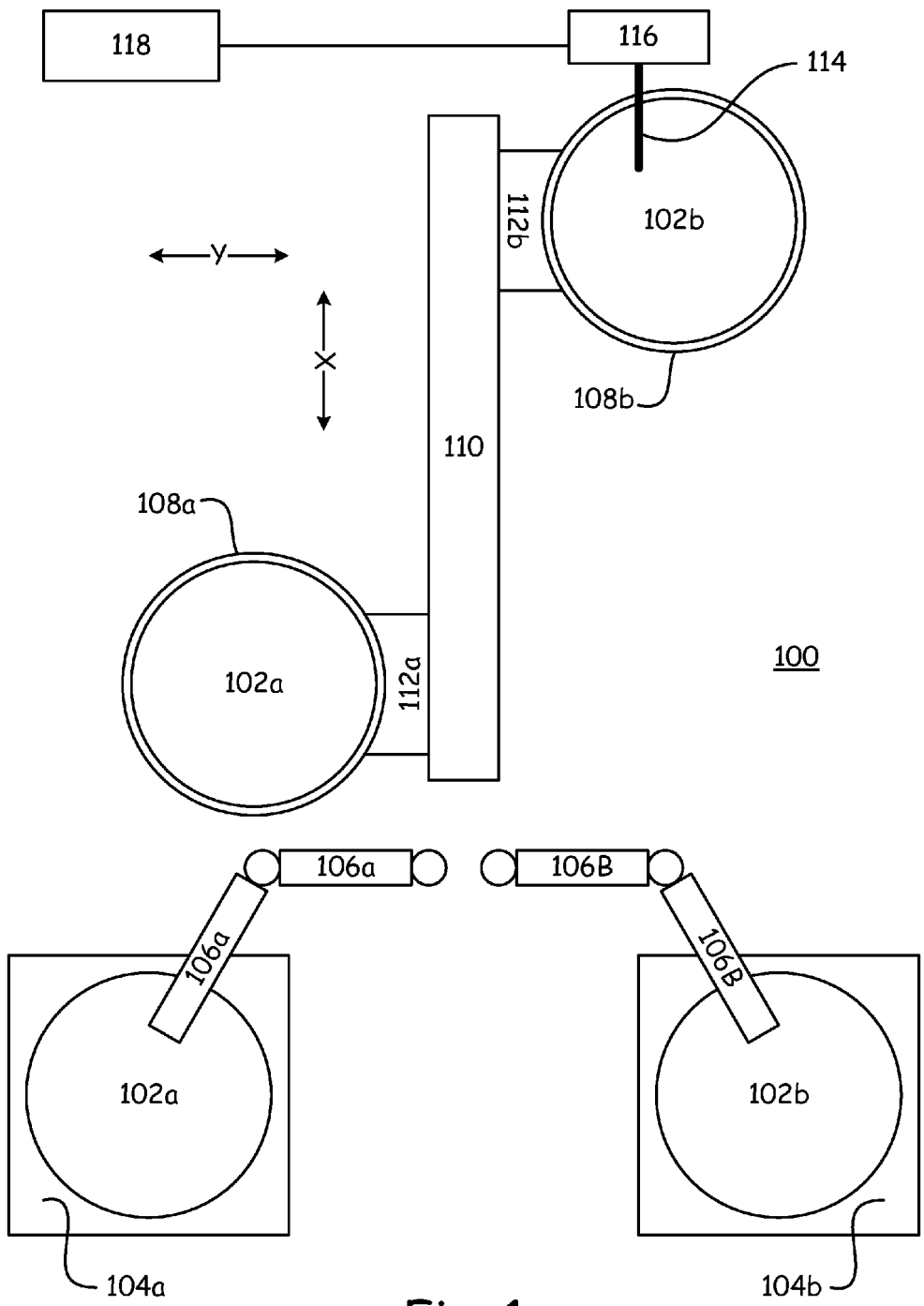
FIG. 1 is a functional block diagram of a dual stage scanning system according to a first embodiment of the present invention.

With reference now to FIG. 1, there is depicted a profilometer 100 according to a first embodiment of the present invention. As a general overview of the system 100, a robot arm 106 removes substrates 102 such as from a cassette elevator 104, and positions the substrates 102 onto a stage 108. The stage 108 is moved in the X axis by a motor 112. The motor 112 in some embodiments can also control rotation of the stage 108 and movement of the stage 108 in the Z axis. In other embodiments, rotation and movement of the stage 108 are accomplished by separate motors that are dedicated to such functions (not depicted so as to not unnecessarily encumber the drawing). Movement of the stage 108 in the Y axis is accomplished by moving a guide rail 110, along which the stage 108 moves in the X axis.

At least some of these elements of the profilometer 100 as described above are duplicated, in that more than one of a given element is provided in some embodiments of the system 100. For example, the profilometer 100 has at least two stages 108a and 108b, which can each hold one substrate 102a and 102b simultaneously. The system 100 also has two motors 112a and 112b, which can move the substrates 102a and 102b independently of one another. However, the system 100 has only one guide rail 110, along which the two stages 108a and 108b move.

In some embodiments, two robots 106a and 106b are provided, for loading substrates 102 onto the stages 108a and 108b. In other embodiments, only a single robot 106 is provided. In some embodiments, substrates 102 are loaded from two different cassette elevators 104a and 104b. In other embodiments, only a single cassette elevator 104 is provided.

The profilometer 100 scans one substrate 102 at a time under the stylus 114. The stylus 114 is connected to a sensor 116, which sends electrical signals to a controller 118, in regard to the surface profile of the substrate 102. The controller 118 also controls the movement of the guide rail 110, stages 108, robot(s) 106, and cassette elevators 104.

In operation, a first substrate 102a is loaded onto the first stage 108a. The motor 112a and the guide rail 100 position the first substrate 102a under the stylus, and begin to scan the substrate 102a back and forth, such as in a serpentine manner, so as to develop a surface profile of the first substrate 102a.

While this first scanning routine of the first substrate 102a is being accomplished, the controller 118 directs a second substrate 102b to be loaded onto the second stage 108b, so that it can be aligned and ready to be scanned as soon as the scanning of the first substrate 102a is completed. Once the scanning of the first substrate 102a is completed, the scanning sequence of the second substrate 102b under the stylus 114 commences without any delay.

While the second substrate 102b is being scanned, the controller 118 directs the first substrate 102a to be off-loaded from the first stage 108a, and a subsequent substrate 102a to be loaded onto the first stage 108a. This subsequent substrate 102a is then aligned and prepared for scanning while the scanning of the second substrate 102b continues, so that the subsequent substrate 102a is ready to be scanned as soon as the scanning of the second substrate 102b is completed.

In this manner, the system 100 never has to wait for a substrate 102 to be loaded and aligned before scanning of the substrate 102 commences, because the next substrate 102 to be scanned is loaded and aligned while the prior substrate 102 is being scanned. This is made possible by the dual scanning stages 108, which move independently of one another in the X, Z, and rotational directions. However, by using a common guide beam 110 to move the substrates 102 in the Y direction, hardware costs of the system 100 are reduced.

Figure 2:
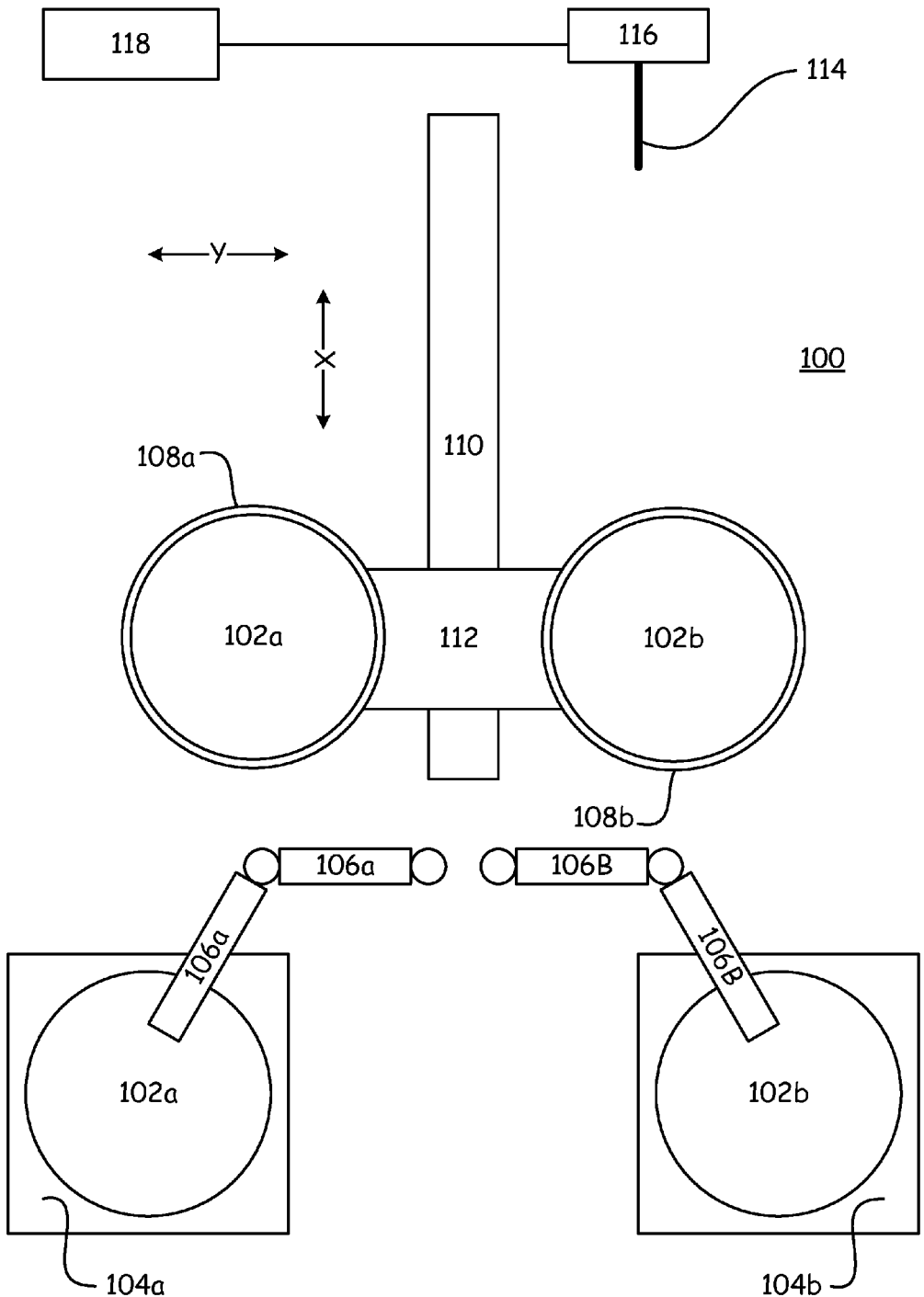
FIG. 2 is a functional block diagram of a dual stage scanning system according to a second embodiment of the present invention.

An embodiment of the profilometer 100 according to another aspect of the invention is depicted in FIG. 2. In this embodiment, the two stages 108 move together in the Y axis according to the movement of the guide rail 110, but also move together in the X axis according to the movement of a single motor 112. In further embodiments according to this aspect of the invention, the two stages 108a and 108b each have separate motors for independent rotation and elevation (movement in the Z axis) of the substrates 102a and 102b. This embodiment could be used, for example, when two optical heads are provided in the profilometer 100, such as when the two optical heads have different resolutions.

The foregoing description of embodiments for this invention has been presented for purposes of illustration and description. It is not intended to be exhaustive or to limit the invention to the precise form disclosed. Obvious modifications or variations are possible in light of the above teachings. The embodiments are chosen and described in an effort to provide illustrations of the principles of the invention and its practical application, and to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A profilometer, comprising:
a guide beam for providing translational movement of substrates in a Y axis relative to a stylus,
a first stage for receiving a first substrate, the first stage slidably mounted to the guide beam, the first stage associated with a first motor for providing independent translational movement for the first stage in an X axis relative to the stylus,
a second stage for receiving a second substrate, the second stage slidably mounted to the guide beam, the second stage associated with a second motor for providing independent translational movement for the second stage in the X axis relative to the stylus,
where the first stage and the second stage can only move together in the Y axis, as the guide beam moves in the Y axis, and move independently of one another in the X axis,
a robot for loading the substrates onto and unloading the substrates off of the first stage and the second stage, and
a controller for directing the robot to load the second substrate onto the second stage, while simultaneously directing the first stage and the guide beam to scan the first substrate on the first stage in the X and Y axes under the stylus, thereby generating profile readings of the first substrate on the first stage.

2. The profilometer of claim 1, further comprising a first Z motor for moving the first stage in a Z axis relative to the stylus, and a second Z motor for moving the second stage in the Z axis relative to the stylus, where the movement of the first stage in the Z axis is independent of the movement of the second stage in the Z axis.

3. The profilometer of claim 1, further comprising a first rotational motor for rotating the first stage relative to the stylus, and a second rotational motor for rotating the second stage relative to the stylus, where the rotation of the first stage is independent of the rotation of the second stage.

4. The profilometer of claim 1, wherein the robot comprises a first robot and a second robot, the first robot for loading the first substrate onto and unloading the first substrate off of the first stage, and the second robot for loading the second substrate onto and unloading the second substrate off of the second stage.

5. A method of profiling a first substrate and a second substrate, the method comprising the steps of:
  loading the first substrate onto a first stage,
  scanning the first stage in an X axis and a Y axis,
  generating profile readings of the first substrate with a stylus,
  loading the second substrate onto a second stage while continuing to generate the profile readings of the first substrate,
  scanning the second stage in the X axis and the Y axis, where movement in the X axis is independent between the first stage and the second stage, and movement in the Y axis is not independent between the first stage and the second stage, and
  generating profile readings of the second substrate with the stylus while the first substrate is unloaded from the first stage.

6. The method of claim 5, further comprising moving the first stage in a Z axis relative to the stylus, and moving the second stage in the Z axis relative to the stylus, where the movement of the first stage in the Z axis is independent of the movement of the second stage in the Z axis.

7. The method of claim 5, further comprising rotating the first stage relative to the stylus, and rotating the second stage relative to the stylus, where the rotation of the first stage is independent of the rotation of the second stage.

\* \* \* \* \*